United States Patent [19]

Misono et al.

[11] 4,096,548
[45] Jun. 20, 1978

[54] MOUNTING STRUCTURE FOR A PRINTED BOARD

[75] Inventors: Shigemi Misono; Yukio Fujimi, both of Tokyo, Japan

[73] Assignee: Kabushiki Kaisha Daini Seikosha, Japan

[21] Appl. No.: 798,083

[22] Filed: May 18, 1977

[30] Foreign Application Priority Data

May 18, 1976 Japan .............................. 51-63049[U]

[51] Int. Cl.² ............................................. H02B 1/02
[52] U.S. Cl. .................................................... 361/399
[58] Field of Search ................... 361/415, 399; 339/91; 74/537, 538

[56] References Cited

U.S. PATENT DOCUMENTS 3,082,356  3/1963  Lovell et al. ......................... 361/415
3,845,359  10/1974  Fedele .................................. 361/415

FOREIGN PATENT DOCUMENTS 1,200,409  9/1965  Germany .......................... 339/91 R Primary Examiner—David Smith, Jr.
Attorney, Agent, or Firm—Robert E. Burns; Emmanuel J. Lobato; Bruce L. Adams

[57] ABSTRACT

A mounting structure for a printed circuit board comprises a rack frame having guide rails to receive the circuit board. The circuit board is retained in fixed position in the rack frame by a leaf spring which is flexibly mounted on the circuit board and has a detent portion engageable in a recess in the rack frame. A rod member mounted on the circuit by means of a bracket is engageable with the leaf spring and is operable to flex the leaf spring between a position in which the detent portion is engaged in the recess of the rack frame to secure the circuit board in position in the rack frame and a position in which the detent portion of the leaf spring is disengaged from the recess so as to release the circuit board for removal from the rack frame. In one form the rod member is rotatable and has a flat portion which is engageable by the leaf spring to disengage the detent portion from the recess. In other forms, the rod member is movable is a lengthwise direction and has a thicker portion and a thinner portion which are alternatively engageable with the leaf spring so as to bring the detent portion into engagement with or to disengage it from the recess in the rack frame.

6 Claims, 6 Drawing Figures

MOUNTING STRUCTURE FOR A PRINTED BOARD

FIELD OF INVENTION

The present invention relates to a mounting structure for a printed circuit board and particularly means for releasably securing the circuit board in a rack frame.

BACKGROUND OF THE INVENTION

A conventional mounting structure for a printed circuit board or the like having a panel secured to its forward edge comprises a rack frame which has guide rails for the circuit board and screw holes for receiving screws which extend through holes in the panel to secure the circuit board with its panel to the rack frame.

In another conventional construction, the circuit board is provided with a screw rod having a threaded tip portion which screws into a tapped hole in a bracket provided on the rack frame to thereby fix the circuit board to the rack frame.

The first mentioned conventional structure is subject to restriction of the circuit board width by the area for receiving the screws because the screws are set at the front face of the rack frame for fixing the panel of the circuit board. Moreover, it presents a poor external appearance since the screwheads protrude out from the panel surface.

The second mentioned conventional structure has no protruding screwheads, but since the parts mounted on the circuit board should be kept out of the path of the angle bracket of the rack frame, the circuit board has a nonusable area on which electronic parts cannot be mounted. The useful area of the circuit board is thereby materially reduced.

SUMMARY OF THE INVENTION

It is an object of the present invention to provide an improved mounting structure for a printed circuit board which overcomes the aforementioned disadvantages. The construction in accordance with the present invention thus does not have projecting screwheads on the panel of the circuit board and, moreover, has a full useful area for electronic parts provided on the circuit board.

In accordance with the invention, the circuit board is secured in a rack frame by a leaf spring which is mounted flexibly on the circuit board and has a detent portion engageable in a recess in the rack frame. A rod member mounted on the circuit board by a bracket cooperates with the leaf spring and is operable, for example by rotation or by lengthwise movement to disengage the detent portion of the leaf spring from the recess in the rack frame so as to release the circuit board for removal from the rack frame.

BRIEF DESCRIPTION OF DRAWINGS

The nature, objects and advantages of the invention will be more fully understood from the following description in conjunction with the accompanying drawings in which.

DESCRIPTION OF PRIOR ART

Figure 1:
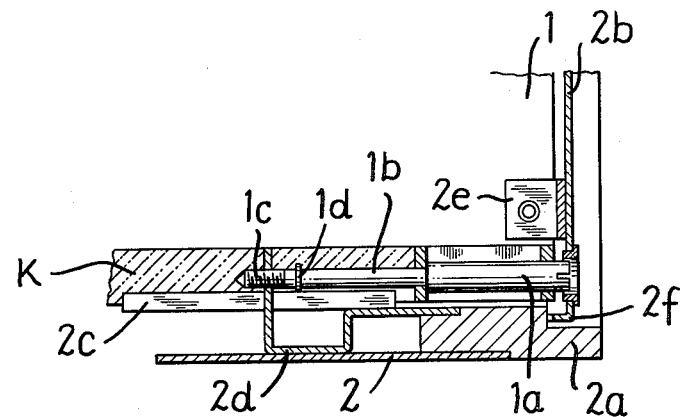
FIG. 1 is a sectional view showing a conventional construction for securing a circuit board in a rack frame.

In FIG. 1 there is shown by way of example the second mentioned conventional construction referred to above. A circuit board 1 having a front panel 2b fixed thereto by angle brackets 2e is provided with a screw rod 1a having a threaded tip portion 1c and a snap ring 1d set in an annular groove in a stem portion 1b. The screw rod 1a is rotatable by means of a screwdriver inserted through a hole in the panel 2b. The threaded tip of the screw rod 1a is engageable in a tapped hole provided in an angle bracket 2d provided on the rack frame 2 so as to fix the circuit board 1 to the rack frame 2 with the panel 2b contacting closely to a shoulder 2f of a frame portion 2a of the rack frame.

The angle bracket 2d of the rack frame necessarily extends inwardly beyond the edge of the circuit board so as to be engageable by the threaded tip of the screw rod 1a provided on the circuit board. Since the electronic parts mounted on the printed circuit board 1 should be kept out of the path of the angle bracket 2b when the circuit board is inserted into the rack frame, the circuit board has a nonuseful area represented by the shaded area K in FIG. 1 on which electronic parts are not mounted. Hence, the useful area of the circuit board is materially reduced.

DESCRIPTION OF PREFERRED EMBODIMENTS

Figure 2:
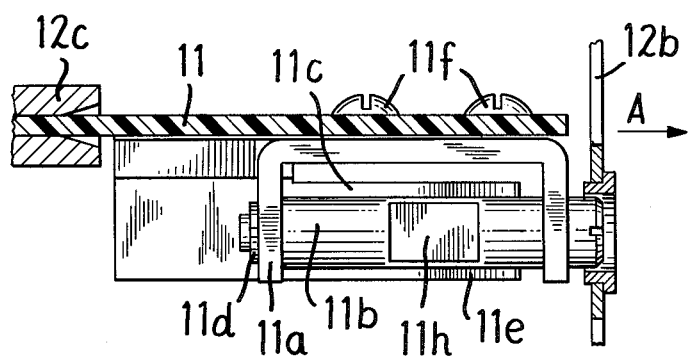
FIGS. 2 and 3 are, respectively, a plan view and a side view showing an embodiment of the present invention.
Figure 3:
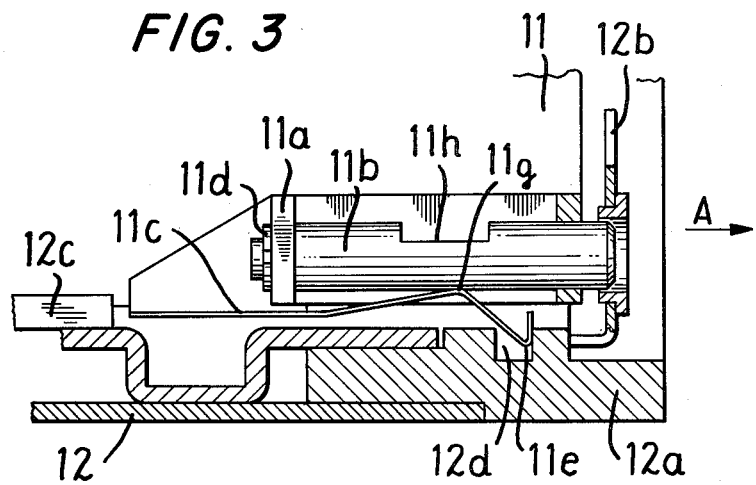

In a first embodiment of the invention, as illustrated by way of example in FIGS. 2 and 3, a printed circuit board 11 is guided and supported at both sides of the circuit board by guide rails 12c which have a concave cross section and are securely fixed on the inner walls of a rack frame 12.

The circuit board 11 is securely connected at its forward edge to an indicating panel 12b by means of angle brackets and screws (not shown). A bracket 11a and a leaf spring 11c are fixed to the circuit board 11 by means of two screws 11f. A rod 11b is roatably supported by the bracket 11a and is kept from sliding out of the bracket by a snap ring 11d. An end portion of the leaf spring 11c is bent to form a detent portion 11e which is engageable with a recess 12d formed in a frame portion 12a of the rack frame 12. An intermediate portion 11g of the leaf spring 11c is engageable with the rotatable rod 11b and the spring is biased so as to press the intermediate portion 11g against the rod. When the rod is rotated by means of a screwdriver slot in its forward end so as to bring a recessed flat surface 11h on one side of the rod into engagement with the intermediate portion 11g of the leaf spring 11c, the leaf spring moves inwardly toward the rod so that the detent portion 11e is disengaged from the recess 12d of the frame portion 12a. The circuit board is thereby released so that it can be withdrawn from the rack frame. When the rod 11b is rotated so as to bring its cylindrical surface into engagement with the intermediate part 11g of the leaf spring 11c, the leaf spring is flexed so as to cause the detent portion 11e to engage in the recess 12d of the frame member 12a thereby securing the circuit board in the rack frame. A connector coupling is provided at the rear end of the circuit board in conventional manner for making electrical connections to the circuit board when the circuit board is in the rack frame.

In the operation of this embodiment, rotation of the rod 11b to make the flat face 11h contact with the leaf spring 11c, the leaf spring moves in a direction toward the rod 11b so that the bent detent portion 11e is disengaged from the recess 12d in the frame 12a. The circuit board 11 is thereby released so that it can be drawn out of the rack frame in the direction of the arrow A along guide rails 12c. A knob (not shown) is provided on the panel 12b for pulling out the circuit board from the connector coupling at the rear end of the board. For mounting the circuit board in the rack frame, the described procedure is reversed.

Figure 4:
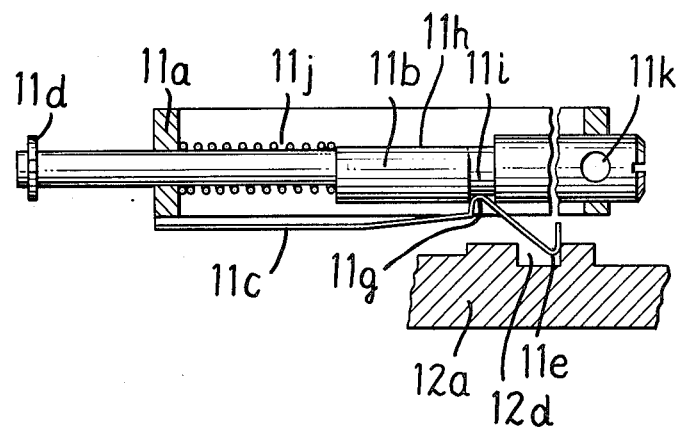
FIG. 4 is a side sectional view showing a second embodiment.

A second embodiment of the invention is shown in FIG. 4 in which corresponding parts are designated by the same reference numerals as in FIGS. 2 and 3. The second embodiment is basically the same as that of FIGS. 2 and 3 but differs in that the rod 11b is somewhat longer and has a larger portion and a smaller portion. The larger portion of the rod 11b has on one side a flat face 11h and also an annular groove 11i formed as a continuation of the flat face. The rod 11b is rotatable and also longitudinally slidable in the bracket 11a fixed to the circuit board. A coil spring 11j surrounds the smaller portion of the rod 11b and acts between the bracket 11a and a shoulder on the rod to bias the rod toward the right as viewed in FIG. 4. Movement of the rod toward the right is limited by a snap ring 11d. The bent portion 11g of the leaf spring 11c is engageable in the groove 11i when the rod is in the position shown in FIG. 4 and holds the rod against longitudinal movement by the coil spring 11j. In this position the detent portion 11e of the leaf spring 11c is engaged in the recess 12d of the frame member 12a to retain the circuit board in the rack frame.

In operation the circuit board is released from the rack frame by turning the rod 11b 180° from the position shown in FIG. 4 so that the flat face 11h is presented to the leaf spring 11c. The bent portion 11g of the leaf spring 11c is thereby disengaged from the groove 11i and can slide over the flat face 11h so that the rod 11b is moved toward the right by the spring force of the coil spring 11j until the snap ring 11d engages the bracket 11a. When the smaller portion of the rod 11b reaches the bent portion 11g of the leaf spring 11c, the leaf spring is thereby permitted to move toward the rod so that the detent portion 11e is disengaged from the recess 12d in the frame member 12a. Moreover, the front end portion of the rod 11b now projects out from the panel 12b. A pulling tool (not shown) is then inserted in a through hole 11k formed in the rod 11b perpendicular to its axis near the front end of the rod and the printed circuit board 11 can thereby be drawn out of the rack frame by the pulling tool. For mounting the circuit board in the rack frame, the described operation is reversed.

Figure 5:
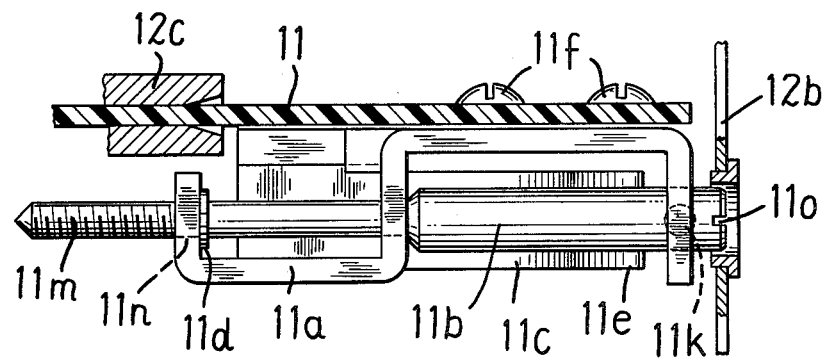
FIGS. 5 and 6 are, respectively, a plan view and a side view showing a third embodiment of the invention.
Figure 6:
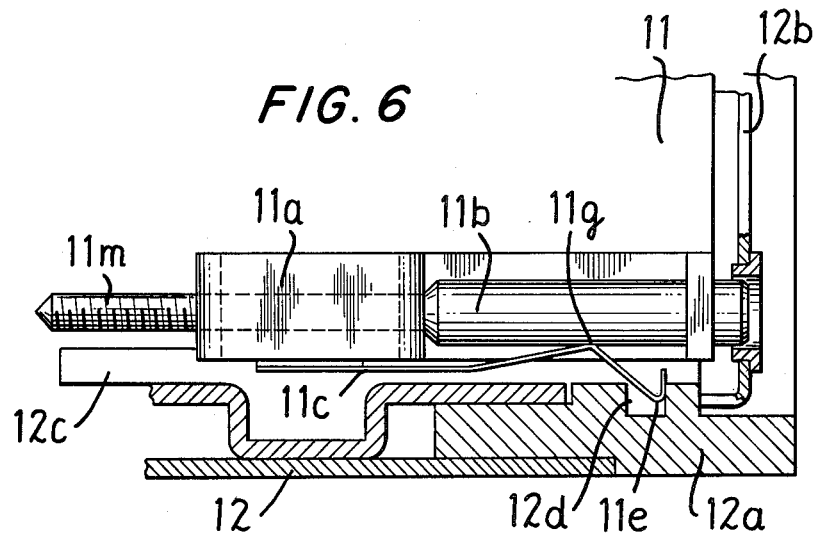

A third embodiment of the invention is shown in FIGS. 5 and 6 in which corresponding parts are designated by the same reference numerals as in FIGS. 2 to 5. The third embodiment is similar to the second embodiment illustrated in FIG. 4 but differs in that the coil spring 11j is omitted as is also the annular groove 11i and in that the rod 11b is formed with a threaded tip portion 11m which screws into a tapped hole 11n in the bracket 11a which is securely fixed to the circuit board 11. When the rod 11b is in the position shown in FIGS. 5 and 6, the leaf spring 11c is engaged by the larger diameter portion of the rod 11b whereby the detent portion 11e of the spring is engaged in the recess 12d of the frame member 12a thereby securing the circuit board in the rack frame.

The operation of the third embodiment will now be described. In the state shown in FIGS. 5 and 6, the circuit board 11 is supported by guide rails 12c of the rack frame 12 and is securely inserted into a connector (not shown) at the rear end of the circuit board. The threaded tip portion 11m of the rod 11b is fully screwed into the tapped hole 11n of the bracket 11a so that the leaf spring 11c is engaged by the larger portion of the rod 11b and the detent portion 11e of the spring is thereby caused to engage in the recess 12d of the frame member 12a so as to secure the circuit board in the rack frame. In order to release the circuit board for withdrawal from the rack frame, a screwdriver is inserted in the slot 11o in the front end of the rod 11b and the rod is turned counterclockwise until the threads are disengaged. The rod 11b is thereby moved lengthwise toward the right as viewed in FIGS. 5 and 6 so that the leaf spring 11c is disengaged from the larger diameter portion and becomes engaged with the smaller diameter portion of the rod. The leaf spring 11c is thereby permitted to move in a direction toward the rod so that the detent portion 11e is disengaged from the recess 12d in the frame member 12a. Accordingly, the circuit board is release for withdrawal out of the rack frame 12. As in the former case, a pulling tool is inserted in the through hole 11k of the rod 11b for pulling the circuit board 11 out of the rack frame and connector. The snap ring 11d on the rod 11b engages the middle wall of the bracket 11a so that the rod 11b is not pulled out. For mounting the circuit board in the rack frame the operations described are reversed.

As described above, the mounting structure for a printed circuit board according to this invention has a recess or groove in the rack frame which is engageable by a leaf spring on the circuit board to hold the circuit board in the rack frame. A bracket fixed on the circuit board is provided with a rod member for engaging the leaf spring so as to move it between a locked position in engagement with the recess of the rack frame and a released position in which the leaf spring is disengaged from the recess so that the circuit board can be withdrawn from the rack frame. With this construction a larger usable area for electronic parts is obtained on the printed circuit board and only the rotation of a single rod serves for releasing the circuit board from the rack frame. This operation is very simple. Moreover, this construction has good reliability against vibration, shock and rough operation.

While preferred embodiments of the invention have been illustrated in the drawings and are herein particularly described, it will be understood that variations and modifications may be made and that the invention is hence in no way limited to this embodiment.

What is claimed is:

1. A mounting structure for a printed circuit board, comprising a rack frame having guide rails to receive the circuit board, leaf spring mounted flexibly on said circuit board and having a detent portion engageable in a recess in said rack frame to retain said circuit board in fixed position in said rack frame, and a rod member cooperating with said leaf spring and operable to disengage said detent portion from said recess to release said circuit board for removal from said rack frame.

2. A mounting structure according to claim 1, wherein said rod member has a recess for receiving a portion of said leaf spring upon rotation of said rod member to disengage said detent portion from said recess to release said circuit board.

3. A mounting structure according to claim 1, wherein said rod member has a thinner portion and a thicker portion and is movable lengthwise to bring said thicker portion and said thinner portion alternatively into engagement with a portion of said leaf spring shift said detent portion between a position disengaged from said recess and a position engaged in said recess.

4. A mounting structure according to claim 3, wherein said rod member provided with means engageable with a tool for moving it lengthwise.

5. A mounting structure according to claim 3, further comprising spring means for biasing said rod member in one lengthwise direction.

6. A mounting structure according to claim 3, in which said rod member is slidable and rotatable in a bracket secured to said circuit board and has a threaded portion engageable with a threaded portion of said bracket whereby said rod member is movable lengthwise by interengagement of said threaded portions upon rotation of said rod member.

* * * * *